United States Patent
Lv et al.

(10) Patent No.: US 11,542,588 B2
(45) Date of Patent: Jan. 3, 2023

(54) MASK DEVICE AND MANUFACTURING METHOD THEREOF, EVAPORATION SYSTEM

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Shouhua Lv, Beijing (CN); Chunchieh Huang, Beijing (CN); De Zhang, Beijing (CN); Rong Zhao, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/768,485

(22) PCT Filed: Jan. 25, 2019

(86) PCT No.: PCT/CN2019/073152
§ 371 (c)(1),
(2) Date: May 29, 2020

(87) PCT Pub. No.: WO2019/179239
PCT Pub. Date: Sep. 26, 2019

(65) Prior Publication Data
US 2020/0384497 A1 Dec. 10, 2020

(30) Foreign Application Priority Data
Mar. 22, 2018 (CN) .......................... 201810240561.7

(51) Int. Cl.
*C23C 14/04* (2006.01)
*B05C 21/00* (2006.01)
(Continued)

(52) U.S. Cl.
CPC .......... *C23C 14/042* (2013.01); *B05C 21/005* (2013.01); *B05D 1/60* (2013.01);
(Continued)

(58) Field of Classification Search
CPC ..................... H01L 51/0011; C23C 14/042
See application file for complete search history.

(56) References Cited

U.S. PATENT DOCUMENTS

2014/0130735 A1* 5/2014 Kim ...................... C23C 14/042
                                                                    118/504
2014/0373780 A1* 12/2014 Han ...................... B05C 21/005
                                                                    118/504
(Continued)

FOREIGN PATENT DOCUMENTS

CN      105839052 A      8/2016
CN      106191769 A      12/2016
(Continued)

OTHER PUBLICATIONS

First Office Action dated Apr. 3, 2019, for corresponding Chinese application No. 201810240561.7.

*Primary Examiner* — Keath T Chen
(74) *Attorney, Agent, or Firm* — Nath, Goldberg & Meyer; Joshua B. Goldberg (57) ABSTRACT

The present disclosure provides a mask device and a manufacturing method thereof, and an evaporation system. The mask device includes a frame, strip alignment plates and a strip support plate, hollow portions are provided in the strip alignment plates, and the strip alignment plates are fixed on the frame; the strip support plate and the strip alignment
(Continued)

plates cross each other, a plurality of welding spots are provided on the surface of the strip support plate proximal to the frame, and are welded and fixed to the frame, and the plurality of welding spots are provided in the region of the strip support plate corresponding to the hollow portions.

20 Claims, 4 Drawing Sheets

(51) Int. Cl.
*B05D 1/00* (2006.01)
*C03C 17/28* (2006.01)
*H01L 51/00* (2006.01)

(52) U.S. Cl.
CPC .......... *C03C 17/28* (2013.01); *H01L 51/0011* (2013.01); *C03C 2218/151* (2013.01); *C03C 2218/34* (2013.01)

(56) References Cited

U.S. PATENT DOCUMENTS

| | | | |
|---|---|---|---|
| 2017/0207390 A1 | 7/2017 | Kim et al. | |
| 2018/0202034 A1* | 7/2018 | Lin | C23C 14/042 |

FOREIGN PATENT DOCUMENTS

| | | | | |
|---|---|---|---|---|
| CN | 107723659 A | 2/2018 | | |
| CN | 108441814 A | 8/2018 | | |
| JP | 2005339858 | * 12/2005 | | C23C 14/24 |

* cited by examiner

MASK DEVICE AND MANUFACTURING METHOD THEREOF, EVAPORATION SYSTEM

CROSS REFERENCE TO RELATED APPLICATIONS

This is a National Phase Application filed under 35 U.S.C. 371 as a national stage of PCT/CN2019/073152 filed on Jan. 25, 2019, an application claiming priority of the Chinese Patent Application No. 201810240561.7 entitled "mask device and manufacturing method thereof, evaporation system" filled on Mar. 22, 2018, each of which is incorporated herein in the entire by reference.

TECHNICAL FIELD

The application relates to the field of manufacturing a mask plate, and in particular to a mask device, a manufacturing method thereof and an evaporation system.

BACKGROUND

At present, a core technology for preparing an OLED screen of high quality is to evaporate three-primary-color (i.e., R, G, B) organic materials on a glass substrate by using an OLED mask plate of high precision. The quality of a mask plate used in the evaporation process directly affects the quality of the OLED screen, so that a structure and a manufacturing method of the mask plate are both important.

SUMMARY

In order to achieve the purpose of the present disclosure, a mask device is provided, and includes a frame, at least two alignment plates and at least one support plate, each of the at least two alignment plates is provided with a hollow portion, and the at least two alignment plates are fixed to the frame;

each support plate of the at least one support plate and a corresponding alignment plate cross each other, and at least one welding spot is on a surface of the at least one support plate opposite to the frame in a region corresponding to the hollow portion to be welded and fixed to the frame.

In an embodiment, the at least two alignment plates and the at least one support plate are strip-shaped, and the at least two alignment plates are located on two sides of the frame.

In an embodiment, each of the at least one support plate includes two end portions opposite to each other, and at least one end portion of the two end portions of each support plate extends from a side of the corresponding alignment plate distal to the frame to a side of the corresponding alignment plate proximal to the frame through the hollow portion, and the at least one welding spot is located at the at least one end portion.

In an embodiment, each of the at least one support plate includes two end portions opposite to each other, and at least one end portion of the two end portions of the support plate extends from a side of the corresponding alignment plate proximal to the frame to a side of the alignment plate distal to the frame through the hollow portion, and the at least one welding spot is at located at the at least one end portion.

In an embodiment, each of the at least one support plate is stacked on a side of the corresponding alignment plate distal to the frame.

In an embodiment, each of the at least one support plate is stacked on a side of the corresponding alignment plate proximal to the frame.

In an embodiment, the hollow portion in each of the at least two alignment plates is a through-hole in a thickness direction of the alignment plate.

In an embodiment, the hollow portion of each of the at least two alignment plates includes a groove on the alignment plate, and an opening of the groove faces a direction perpendicular to an extending direction of the alignment plate and faces the end portion of the corresponding support plate.

In an embodiment, the at least one support plate is parallel to each other and spaced apart from each other.

In an embodiment, a plurality of welding spots are in at least one row in a direction perpendicular to a length direction of the support plate, and welding spots in a same row are arranged at an interval in a direction parallel to the length direction of the support plate.

In an embodiment, positioning holes are in each of the at least two alignment plates. In an embodiment, the mask device further includes two alignment plates parallel to each other; the mask device further includes at least one strip shielding plate, each of which is between the two alignment plates and parallel to the two alignment plates, and the at least one strip shielding plate is arranged at an interval.

In an embodiment, the mask device further includes at least one strip mask plate and at least two strip shielding plates, one of the at least one strip mask plate is between every two adjacent strip shielding plates of the at least two strip shielding plates, and openings are on each of the at least one strip mask plate.

As another solution, the present disclosure further provides an evaporation system for evaporating a film, which includes the mask device provided by the present disclosure.

As another solution, the present disclosure further provides a method for manufacturing a mask device, including:

preparing a frame;

forming at least two alignment plates such that hollow portions are formed in the at least two alignment plates, and the at least two alignment plates are fixed to the frame;

forming at least one support plate corresponding to the at least two alignment plates such that each of the at least one support plate and a corresponding alignment plate cross each other, and at least one welding spot is formed on a surface of the support plate opposite to the frame in an region corresponding to the hollow portion to be welded and fixed to the frame.

In an embodiment, the step of forming at least one support plate corresponding to the at least two alignment plates includes: causing an end portion of each support plate of at least one support plate to extend from a side of the corresponding alignment plate distal to the frame to a side of the alignment plate proximal to the frame through a hollow portion of the alignment plate, and forming the at least one welding spot at the end portion.

In an embodiment, the step of forming at least one support plate corresponding to the at least two alignment plates includes: causing an end portion of each support plate of at least one support plate to extend from a side of the corresponding alignment plate proximal to the frame to a side of the alignment plate distal to the frame through a hollow portion of the alignment plate, and forming the at least one welding spot at the end portion.

In an embodiment, the step of forming at least one support plate corresponding to the at least two alignment plates includes: stacking each of the at least one support plates on a side of the corresponding alignment plate distal to the frame.

In an embodiment, the step of forming at least one support plate corresponding to the at least two alignment plates includes: stacking each of the at least one support plate on a side of the corresponding alignment plate proximal to the frame.

In an embodiment, the forming at least two alignment plates such that hollow portions are formed in the at least two alignment plates includes: forming grooves on the at least two alignment plates such that openings of the grooves face a direction perpendicular to an extending direction of the alignment plates and face the end portions of the support plate.

DETAIL DESCRIPTION OF EMBODIMENTS

A mask device and the manufacturing method thereof of the present disclosure are described in detail below with reference to the accompanying drawings, such that those skilled in the art may understand the technical solution of the present disclosure better.

A mask device in the related art includes a frame, strip alignment plates and a strip support plate, the strip support plate is welded on the frame and is used for supporting a strip mask plate; the strip alignment plates are welded on the frame, the strip alignment plates and the strip support plate cross each other, and the strip alignment plates are used for aligning with a glass substrate. The mask device in the related art inevitably has the following problems in practical applications: at the intersection of the strip alignment plate and the strip support plate, the strip alignment plate may block some welding spots of the strip support plate, when it is required to repair the welding spots, it is required to tear off the strip alignment plate first, which could waste the strip alignment plate. In addition, re-welding the strip alignment plate may cause a change for an alignment reference of the strip alignment plate, thereby bringing difficulty to a subsequent alignment work.

Figure 1:
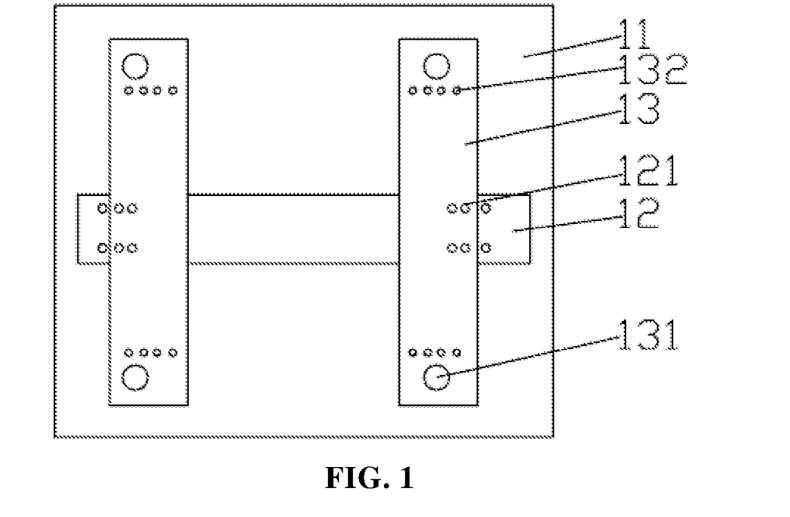
FIG. 1 is a schematic structural view of a mask device in the related art.

Referring to FIG. 1, a mask device in the related art includes a frame 11, strip alignment plates 13, and a strip support plate 12, and the strip support plate 12 is first welded to the frame 11. The strip alignment plates 13 are then welded to the frame 11. And, the strip alignment plates 13 and the strip support plate 12 cross each other and are welded to the frame 11 by a plurality of welding spots 132 and a plurality of welding spots 121. The strip support plate 12 is used to support a strip mask plate (not shown) having effective evaporation openings. Positioning holes 131 are provided on the strip alignment plates 13 for aligning with positioning marks on a glass substrate (not shown). It should be noted that, the welding spots 132 on the strip alignment plates 13 and the welding spots 121 on the strip support plate 12 shown in FIG. 1 are all in contact with the frame 11.

However, at the intersection of the strip alignment plates 13 and the strip support plate 12, the strip alignment plates 13 may block some welding spots 121 of the strip support plate 12. After a period of time, the welding spots 121 may be damaged, and therefore, it is required to repair the welding spots 121. When repairing the welding spots 121, it is required to tear off the strip alignment plate 13 first, which wastes a material of the strip alignment plate. In addition, re-welding the strip alignment plate 13 may cause a change for an alignment reference of the strip alignment plate 13, thereby bringing difficulty to a subsequent alignment work.

Figure 2:
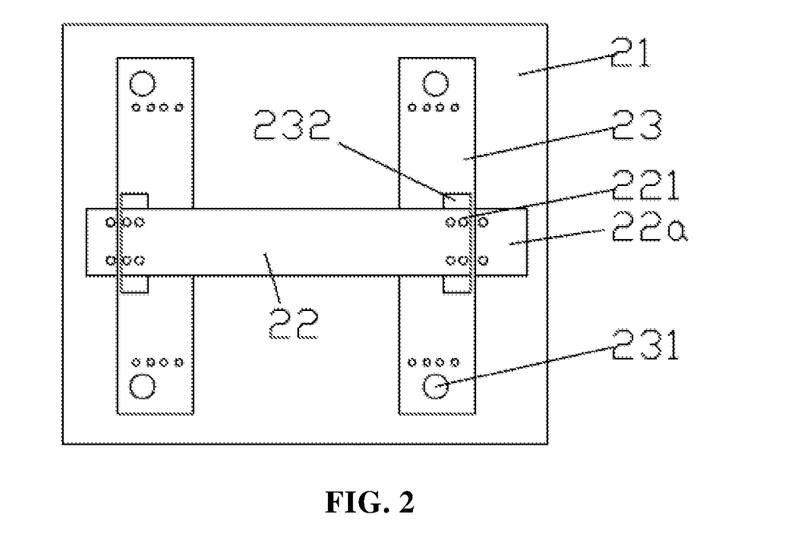
FIG. 2 is a schematic structural view of a mask device according to an embodiment of the present disclosure.

In order to solve the above problem, as shown in FIG. 2, an embodiment of the present disclosure provides a mask device, which includes a frame 21, strip alignment plates 23 and a strip support plate 22, and hollow portions 232 are provided in the strip alignment plates 23, and the strip alignment plates 23 are fixed on the frame 21. The strip support plate 22 and the strip alignment plates 23 cross each other, and a plurality of welding spots 221 are provided on a surface of the strip support plate 22 proximal to the frame 21.

With the above hollow portions 232, all of welding spots 221 of the strip support plate 22 may be caused to be exposed, and may not be blocked by the strip alignment plates 23. When it is required to repair the welding spots 221, it does not need to tear off the strip alignment plate 23, which avoids wasting a material of the strip alignment plate and avoids causing a change for an alignment reference of the strip alignment plates 23, and thereby avoids bringing difficulty to a subsequent alignment work.

Optionally, at least a portion of the welding spots 221 are welded and fixed to the frame 21 through the hollow portions 232.

Specifically, in the present embodiment, end portions 22a of the strip support plate 22 extend from a side of the strip alignment plates 23 distal to the frame 21 to the side of the strip alignment plates 23 proximal to the frame 21 through the hollow portions 232, and all of the welding spots 221 are provided at the end portions 22a. The end portions 22a of the strip support plate 22 are portions extending from a middle region of the strip support plate 22 to two ends. In other words, the strip support plate 22 includes the middle region and two edge regions located at two sides of the middle region, and the middle region is located at one side of the strip alignment plates 23 distal to the frame 21; and the two edge regions are located on the side of the strip alignment plates 23 proximal to the frame 21. And, all of the welding spots 221 are provided in the edge regions.

In the present embodiment, there are two strip alignment plates 23, and the two strip alignment plates 23 are parallel to each other. In this case, the two end portions 22a of the strip support plate 22 respectively extend from the side of the two strip alignment plates 23 distal to the frame 21 to the side of the two strip alignment plates 23 proximal to the frame 21 through the hollow portions 232. The two end portions 22a of the strip support plate 22 are portions extending from the middle region of the strip support plate 22 to the two ends. In other words, the strip support plate 22 includes a middle region and two edge regions located at two sides of the middle region, and the middle region is located at one side of the strip alignment plates 23 distal to the frame 21; and the two edge regions are located on the side of the two strip alignment plates 23 proximal to the frame 21, respectively.

The end portions 22a of the strip support plate 22 extend from the side of the strip alignment plates 23 distal to the frame 21 to the side of the strip alignment plates 23 proximal to the frame 21 through the hollow portions 232, such that the strip support plate 22 may press the strip alignment plates 23 onto a surface of the frame 21. When the mask device is used, stability of the strip alignment plates 23 may be strengthened, thereby causing the alignment reference to be more stable, and improving evaporation stability.

In the present embodiment, the hollow portion 232 includes a through-hole provided along a thickness direction of the strip alignment plate 23.

In the present embodiment, the plurality of welding spots 221 are arranged in at least one row in a direction perpendicular to an extending direction of the strip support plate 22, and the plurality of welding spots 221 in the same row are arranged at an interval along a direction parallel to the extending direction of the strip support plate 22. Of course, the plurality of welding spots 221 may be arranged in any manner in practical applications.

In this embodiment, the strip alignment plates 23 are fixed on the frame by welding.

In the present embodiment, positioning holes 231 are provided in the strip alignment plates 23. When a glass substrate is placed on the mask device, the positioning holes 231 are aligned with alignment marks on the glass substrate, thereby completing the alignment of the mask device with the glass substrate.

Figure 3A:
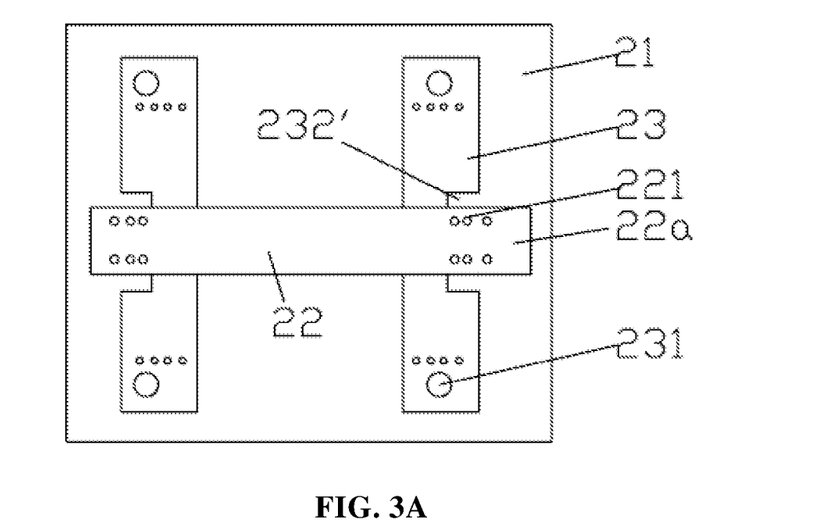
FIG. 3A is a schematic structural view of a mask device according to an embodiment of the present disclosure.

Referring to FIG. 3A, a mask device provided in the present embodiment is substantially the same as the mask device provided in the embodiment shown in FIG. 2, except that the structure of the hollow portions is different.

Specifically, in the present embodiment, the hollow portions 232' include grooves provided on the strip alignment plates 23, and openings of grooves face a direction perpendicular to the extending direction of the strip alignment plates 23 and face the end portions 22a of the strip support plate 22. Such grooves could also expose all of the welding spots 221.

Figure 3B:
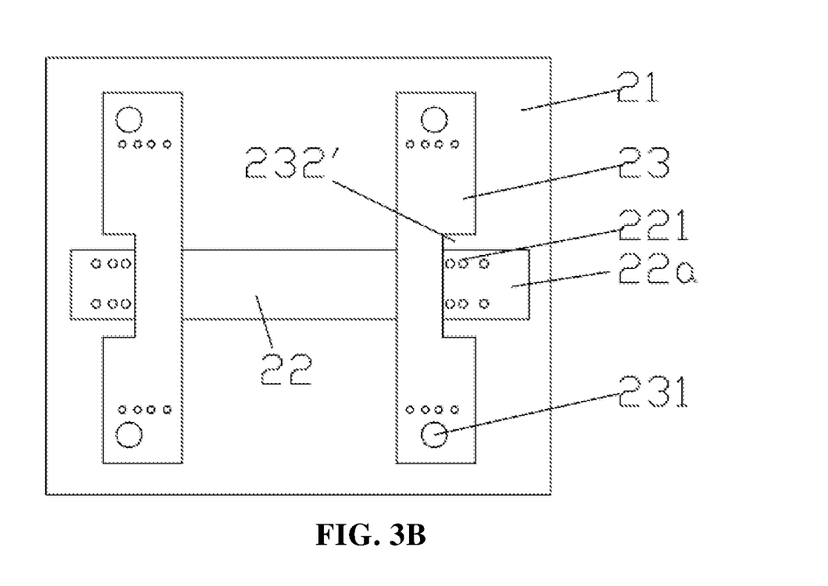
FIG. 3B is a schematic structural view of a mask device according to an embodiment of the present disclosure.

It should be noted that, in the present embodiment, the strip alignment plates 23 are welded on the frame 21 first; the strip support plate 22 is then welded on the frame 21. That is, the strip support plate 22 is located above the strip alignment plates 23. However, the present disclosure is not limited to this, and in practical applications, as shown in FIG. 3B, the strip support plate 22 may be welded on the frame 21 first; the strip alignment plates 23 are then welded on the frame 21. That is, the strip alignment plates 23 are located above the strip support plate 22. Such grooves could also expose all of the welding spots 221.

Figure 4:
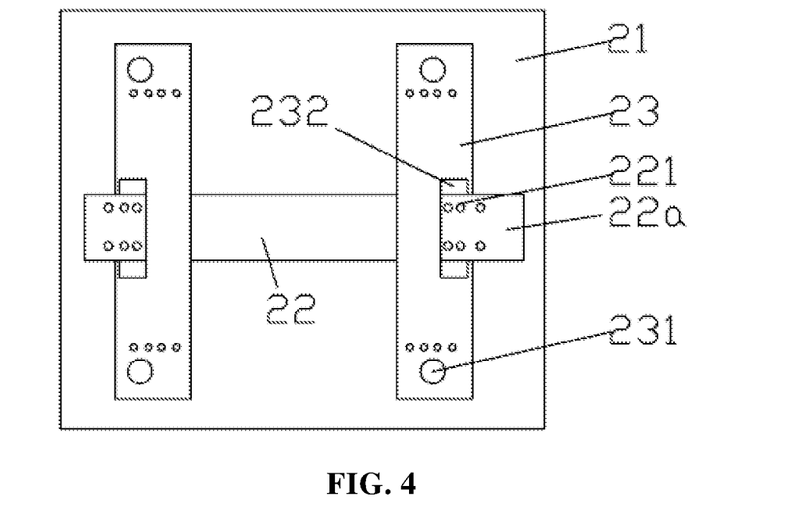
FIG. 4 is a schematic structural view of a mask device according to an embodiment of the present application.

Referring to FIG. 4, a mask device provided in the present embodiment is substantially the same as the mask device provided in the embodiment shown in FIG. 2, except that the strip support plate 22 is provided in a different manner.

Specifically, in the present embodiment, end portions 22a of the strip support plate 22 extend from the side of the strip alignment plates 23 proximal to the frame 21 to the side of the strip alignment plates 23 distal to the frame 21 through the hollow portions 232, and all of the welding spots 221 are provided at the end portions 22a. In other words, the direction in which the end portions 22a of the strip support plate 22 pass through the hollow portions 232 in the present embodiment is opposite to the direction in which the end portions 22a of the strip support plate 22 pass through the hollow portions 232 in the first embodiment shown in FIG. 2, that is, the middle region of the strip support plate 22 is located on the side of the strip alignment plates 23 proximal to the frame 21, and the edge regions of the strip support plate 22 are located on the side of the strip alignment plates 23 distal to the frame 21. At least a portion of the welding spots 221 may pass through the hollow portions 232, and it is ensured that all of the welding spots 221 are exposed.

The end portions 22a of the strip support plate 22 extend from the side of the strip alignment plates 23 proximal to the frame 21 to the side of the strip alignment plates 23 distal to the frame 21 through the hollow portions 232, such that the strip support plate 22 may press the strip alignment plates 23 onto a surface of the frame 21. When the mask device is used, stability of the strip alignment plates 23 may be strengthened, thereby causing the alignment reference to be more stable, and improving evaporation stability.

Figure 5A:
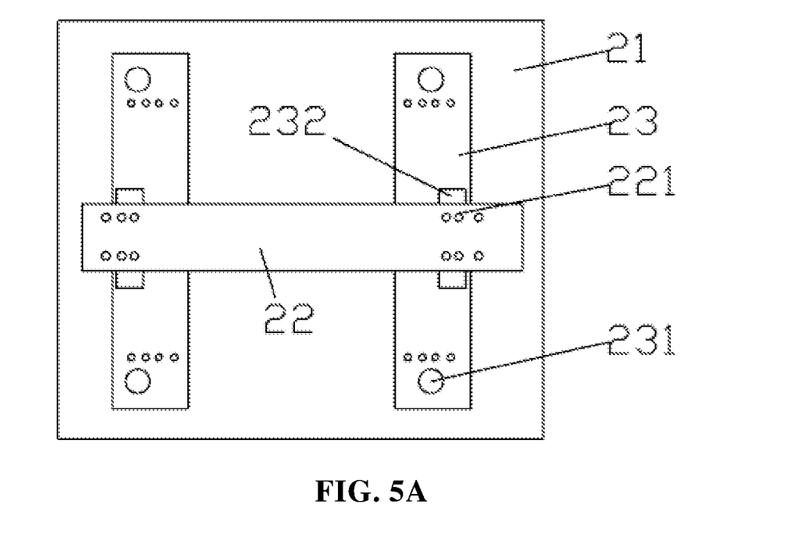
FIG. 5A is a schematic structural view of a mask device according to an embodiment of the present application.

Referring to FIG. 5A, a mask device provided in the present embodiment is substantially the same as the mask device provided in the embodiment shown in FIG. 2, except that the arrangement of the strip support plate 22 is different.

Specifically, in the present embodiment, the strip support plate 22 is stacked on the strip alignment plates 23, and the plurality of welding spots 221 are welded and fixed to the frame 21 through the hollow portions 232. That is, the middle region and the edge regions of the strip support plate 22 are both located on the side of the strip alignment plates 23 distal to the frame 21. Some welding spots 221 may pass through the hollow portions 232 to be in contact with the frame 21.

Figure 5B:
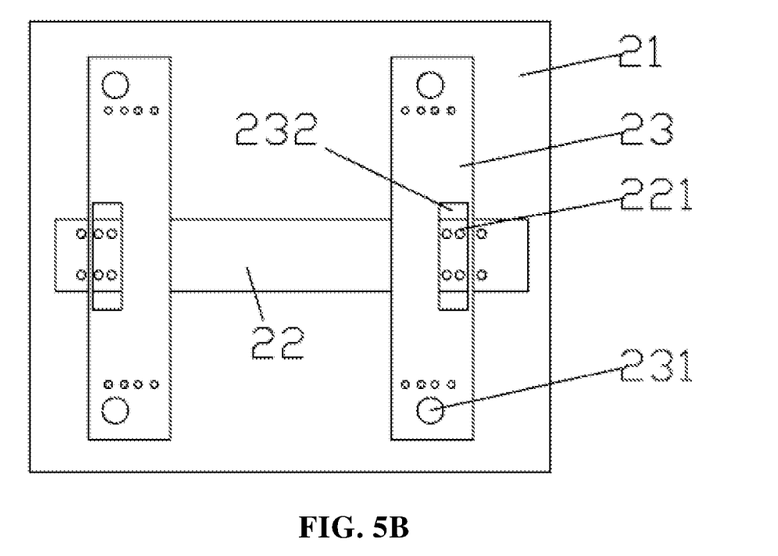
FIG. 5B is a schematic structural view of a mask device according to an embodiment of the present invention.

Note that, in the present embodiment, the strip support plate 22 is stacked on the strip alignment plates 23. However, the present disclosure is not limited to this, and in practical applications, as shown in FIG. 5B, the strip alignment plates 23 are stacked on the strip support plate 22. All of the welding spots 221 are also exposed.

Figure 6:
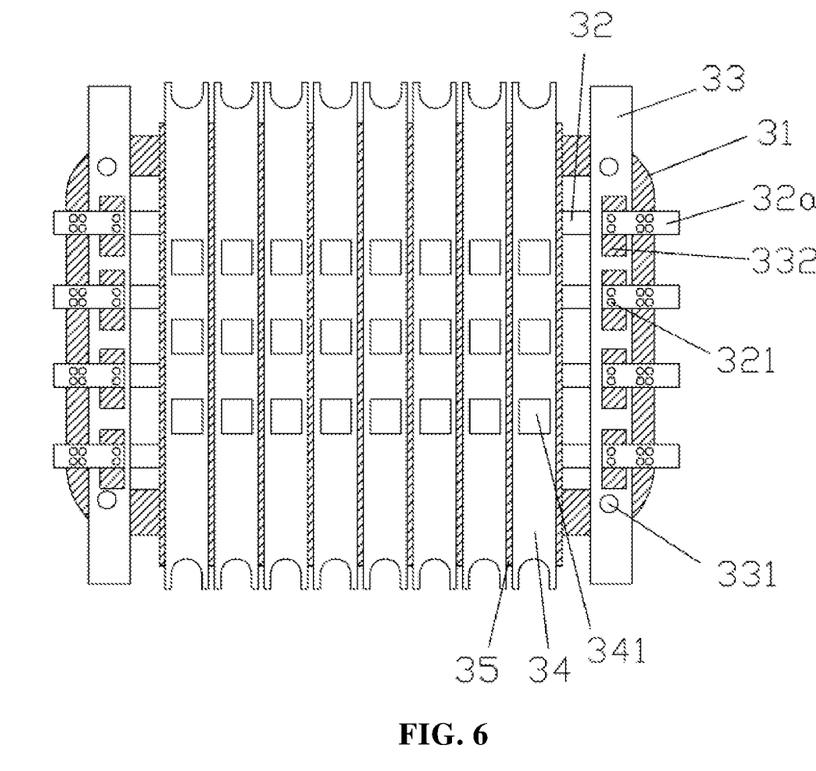
FIG. 6 is a schematic structural view of a mask device according to an embodiment of the present application.

Referring to FIG. 6, the structure of the mask device provided in the present disclosure is improved based on the above embodiments. Specifically, the mask device includes a frame 31, strip alignment plates 33, and strip support plates 32, and the frame 31 is a rectangular body. The strip alignment plates 33 are provided with hollow portions 332, and the strip alignment plates 33 are fixed on the frame 31. In practical applications, the strip alignment plates 33 may be fixed on the frame 31 by welding.

The strip support plates 32 and the strip alignment plates 33 cross each other, and a plurality of welding spots 321 are provided on a surface of the strip support plates 32 proximal to the frame 31, and the plurality of welding spots 321 are welded and fixed to the frame 31 through the hollow portions 332. In the present embodiment, the end portions 32a of the strip support plates 32 extend from the side of the strip alignment plates 33 proximal to the frame 31 to the side of the strip alignment plates 33 distal to the frame 31 through the hollow portions 332, so that the plurality of welding spots 321 are all in contact with the frame 31, that is, the strip support plates 32 are provided in the manner of the embodiment shown in FIG. 4. Of course, the strip support plates 32 may also be provided in the manner of the other embodiments described above.

In the present embodiment, the mask device includes a plurality of strip support plates 32, and the plurality of strip support plates 32 are parallel to each other and spaced apart from each other, so as to perform a more stable supporting function.

In this embodiment, the mask device further includes a plurality of strip mask plates 34, each of which is provided with openings 341. When a deposition process is performed, a deposition material is deposited on the glass substrate through the openings 341, and finally a pattern is formed on the glass substrate.

In the present embodiment, the mask device includes two strip alignment plates 33, and the two strip alignment plates 33 are parallel to each other; moreover, the mask device further includes a plurality of strip shielding plates 35, each of which is located between two adjacent strip mask plates 34, and is parallel to the strip mask plates 34, and the plurality of strip shielding plates 35 are arranged at an interval. One strip mask plate 34 is provided between two adjacent strip shielding plates 35, so that the openings 341 on the plurality of strip mask plates 34 are arranged in an array.

In summary, in the mask device provided in the above embodiments of the present disclosure, the strip alignment plates are provided with the hollow portions. With the above hollow portions, all of welding spots of the strip support plate may be caused to be exposed, and may not be blocked by strip alignment plates. When it is required to repair the welding spots, it is not required to tear off the strip alignment plate, which avoids wasting a material of the strip alignment plate and avoids causing a change for an alignment reference of the strip alignment plate, and thereby avoids bringing difficulty to a subsequent alignment work.

As another technical solution, an embodiment of the present disclosure further provides an evaporation system for evaporating a film, such as an organic film. The evaporation system includes the mask device provided by each embodiment of the present disclosure.

As another technical solution, the present disclosure further provides a method for manufacturing a mask device, including:

preparing a frame;

forming strip alignment plates such that hollow portions are formed in the strip alignment plates; and forming a strip support plate such that the strip support plate and the strip alignment plates cross each other, a plurality of welding spots are formed on the surface of the strip support plate proximal to the frame, and some of the plurality of welding spots are formed in a region of the strip support plate corresponding to the hollow portions.

In the related art, the mask device is manufactured by welding the strip support plate on the frame and then welding the strip alignment plates on the frame. However, this has following problems in practical applications: as shown in FIG. 1, at the intersection of the strip alignment plates 13 and the strip support plate 12, the strip alignment plates 13 may block some welding spots 121 of the strip support plate 12, which reduces the welding firmness of the strip support plate 12. When it is required to repair the welding spots 121, it is required to tear off the strip alignment plate 13 first, which wastes a material of the strip alignment plate. In addition, re-welding the strip alignment plate 13 may cause a change for an alignment reference of the strip alignment plate 13, thereby bringing difficulty to a subsequent alignment work.

In order to solve the above problems, as shown in FIG. 2, the method of manufacturing the mask device provided by the present disclosure is to form the hollow portions 232 in the strip alignment plates 23 in advance, and weld the strip alignment plates 23 on the frame 21 first. The strip support plate 22 is then welded on the frame 21.

With the above hollow portions 232, all of welding spots 221 of the strip support plate 22 may be caused to be exposed, and may not be blocked by strip alignment plates 23. When it is required to repair the welding spots 221, it is not required to tear off the strip alignment plate 23, which avoids wasting a material of the strip alignment plate and avoids causing a change for an alignment reference of the strip alignment plate 23, and thereby avoids bringing difficulty to a subsequent alignment work.

It is to be understood that, the above embodiments are merely exemplary embodiments adopted to illustrate the principles of the present disclosure, but the present disclosure is not limited thereto. It will be apparent to those skilled in the art that various changes and modifications may be made without departing from the spirit of the application, and these changes and modifications are also considered to be within the scope of the application.

What is claimed is:

1. A mask device, comprising a frame, and at least two alignment plates and at least one support plate arranged on the frame, wherein each of the at least two alignment plates is provided with a through-hole in a thickness direction of the alignment plate, and the at least two alignment plates are fixed to the frame;

the at least one support plate and a corresponding alignment plate of the at least two alignment plates cross each other, and at least one welding spot is on a surface of the at least one support plate facing towards the frame in a region corresponding to the through-hole to be welded and fixed to the frame;

each of the at least one support plate comprises two end portions opposite to each other; and at least one end portion of the two end portions of each support plate extends from a first side in the thickness direction of the corresponding alignment plate to a second side, opposite to the first side, in the thickness direction of the corresponding alignment plate through the through-hole, and the at least one welding spot is located at the at least one end portion.

2. The mask device of claim 1, wherein the at least two alignment plates and the at least one support plate are strip-shaped, and the at least two alignment plates are located on two sides of the frame.

3. The mask device of claim 2, wherein at least one end portion of the two end portions of each support plate extends from a side in the thickness direction of the corresponding alignment plate away from the frame to a side in the thickness direction of the corresponding alignment plate close to the frame through the through-hole, and the at least one welding spot is located at the at least one end portion.

4. The mask device of claim 2, wherein at least one end portion of the two end portions of the support plate extends from a side in the thickness direction of the corresponding alignment plate close to the frame to a side in the thickness direction of the corresponding alignment plate away from the frame through the through-hole, and the at least one welding spot is at located the at least one end portion.

5. The mask device of claim 1, wherein the at least one support plate comprises a plurality of support plates which are parallel to each other and spaced apart from each other.

6. The mask device of claim 1, wherein the at least one welding spot comprises a plurality of welding spots which are in at least one row in a direction perpendicular to a length direction of the support plate, and welding spots in a same row of the at least one row are arranged at an interval in a direction parallel to the length direction of the support plate.

7. The mask device of claim 1, wherein each of the at least two alignment plates is provided with positioning holes.

8. The mask device of claim 1, wherein the at least two alignment plates comprise two alignment plates which are parallel to each other; the mask device further comprises at least one strip shielding plate, each of which is between the two alignment plates and parallel to the two alignment plates, and the at least one strip shielding plate comprises a plurality of strip shielding plates which are arranged at an interval.

9. The mask device of claim 8, further comprising at least one strip mask plate and at least two strip shielding plates, wherein one of the at least one strip mask plate is between every two adjacent strip shielding plates of the at least two strip shielding plates; and each of the at least one strip mask plate is provided with openings.

10. An evaporation system for evaporating a film, comprising the mask device of claim 1.

11. A mask device, comprising a frame, and at least two alignment plates and at least one support plate arranged on the frame, wherein
each of the at least two alignment plates is provided with a through-hole, and the at least two alignment plates are fixed to the frame;
the at least one support plate and a corresponding alignment plate of the at least two alignment plates cross each other, and at least one welding spot is on a surface of the at least one support plate facing towards the frame in a region corresponding to the through-hole to be welded and fixed to the frame; and
the at least one support plate extends through the through-hole and continues beyond the corresponding alignment plate to be fixed to the frame at a position outside the corresponding alignment plate.

12. The mask device of claim 11, wherein each of the at least one support plate is stacked on a side of the corresponding alignment plate away from the frame.

13. The mask device of claim 11, wherein each of the at least one support plate is stacked on a side of the corresponding alignment plate close to the frame.

14. The mask device of claim 11, wherein the through-hole of each of the at least two alignment plates comprises a groove on the alignment plate, and an opening of the groove faces a direction perpendicular to an extending direction of the alignment plate and faces the end portion of the corresponding support plate.

15. A method for manufacturing a mask device, comprising:
preparing a frame;
forming at least two alignment plates such that through-holes in a thickness direction of the alignment plates are formed in the at least two alignment plates, wherein the at least two alignment plates are fixed to the frame;
forming at least one support plate corresponding to the at least two alignment plates such that each of the at least one support plate and a corresponding alignment plate of the at least two alignment plates cross each other, and at least one welding spot is formed on a surface of the support plate facing towards the frame in a region corresponding to the through-hole to be welded and fixed to the frame;
each of the at least one support plate comprises two end portions opposite to each other; and
at least one end portion of the two end portions of the support plate extends from a first side in the thickness direction of the corresponding alignment plate to a second side, opposite to the first side, in the thickness direction of the corresponding alignment plate through the through-hole, and the at least one welding spot is located at the at least one end portion.

16. The method of claim 15, wherein the step of forming at least one support plate corresponding to the at least two alignment plates comprises: causing the end portion of the support plate to extend from a side in the thickness direction of the corresponding alignment plate away from the frame to a side in the thickness direction of the corresponding alignment plate of the alignment plate close to the frame through the through-hole of the alignment plate, and forming the at least one welding spot at the end portion.

17. The method of claim 15, wherein the step of forming at least one support plate corresponding to the at least two alignment plates comprises: causing the end portion of the support plate to extend from a side in the thickness direction of the corresponding alignment plate close to the frame to a side in the thickness direction of the alignment plate away from the frame through the through-hole of the alignment plate, and providing the at least one welding spot at the end portion.

18. The method of claim 15, wherein the step of forming at least one support plate corresponding to the at least two alignment plates comprises: stacking each support plate of the at least one support plates on a side of the corresponding alignment plate distal to the frame.

19. The method of claim 18, wherein the forming at least two alignment plates such that through-holes are formed in the at least two alignment plates comprises: forming grooves on the at least two alignment plates such that openings of the grooves face a direction perpendicular to an extending direction of the alignment plates and face the end portions of the support plate.

20. The method of claim 15, wherein the step of forming at least one support plate corresponding to the at least two alignment plates comprises: stacking each support plate of the at least one support plate on a side of the corresponding alignment plate proximal to the frame.

* * * * *